United States Patent [19]

Salter et al.

[11] 4,355,395

[45] Oct. 19, 1982

[54] INJECTION LASERS

[75] Inventors: Stuart R. Salter; David R. Smith, both of Suffolk, England

[73] Assignee: British Telecommunications, London, England

[21] Appl. No.: 895,060

[22] Filed: Apr. 10, 1978

[51] Int. Cl.³ .............................................. H01S 3/13
[52] U.S. Cl. ...................................... 372/38; 372/29; 372/44
[58] Field of Search ...................... 331/94.5 S, 94.5 H, 331/94.5 M; 307/312

[56] References Cited
U.S. PATENT DOCUMENTS 4,009,385  2/1977  Sell ............................... 331/94.5 M
4,019,048  4/1977  Maione et al. ................. 331/94.5 M

OTHER PUBLICATIONS

RCA Technical Notes; Witike et al; TN No: 1005; Apr. 9, 1975; pp. 1-3.
Physics Today; Junction Lasers; L. A. D'Asaro et al; Mar. 1971, vol. 24, No. 3; (see Fig. 3, p. 45).

Primary Examiner—William L. Sikes
Assistant Examiner—Léon Scott, Jr.
Attorney, Agent, or Firm—Kemon & Estabrook

[57] ABSTRACT

Apparatus for stabilizing output characteristics of an injection laser has a light sensitive device for producing an electrical signal indicative of the d.c. output light level of the laser. The electrical signal is compared with a reference signal to produce a further signal which is applied to d.c. bias control means for the laser. The d.c. bias control means responds to the further signal to adjust the d.c. bias level such that the d.c. light output level remains substantially at a predetermined level. The means or peak output of the laser can be controlled in a similar manner.

4 Claims, 5 Drawing Figures

INJECTION LASERS

This invention relates to the stabilisation of the optical output characteristics of an injection laser.

Semiconductor injection lasers (e.g. gallium arsenide lasers) have been proposed for use in optical communication systems to convert either digital or analogue electrical signals into optical signals. A problem in such applications is that the output characteristics of a semiconductor laser change with temperature and passage of time. The output characteristics which can vary are:

$I_q$ the laser threshold current, (dP/dI) $I>I_q$, the laser efficiency $\alpha$ when the current applied to the laser is greater than the threshold current, and (dP/dI) $I<I_q$, the spontaneous efficiency $\beta$ when the current applied to the laser is less than the threshold current where P is the optical output power of the laser and I the current applied to the laser.

In addition there is an unwanted switch-on time delay for lasing action between the application of the input modulating current and the appearance of the optical output pulse when the bias current $I_b$ applied to the laser is below the threshold current $I_q$. This is usually of importance as it is preferable to operate the laser with its bias current $I_b$ below $I_q$ for two reasons in most digital systems:

(i) optimise the ratio between the 'on' and 'off' pulses within the limits permitted by the unwanted switch-on delay and the maximum permitted peak optical output power. For low speed digital systems e.g. 8 Mbits/s, the d.c. bias current may be zero.

(ii) as $\beta<\alpha$, a less sensitive control of the bias current is required in order to maintain the optical output power in the 'off' state at or substantially at a predetermined level.

For intensity modulated, frequency modulated and very high speed digital systems it may be preferable to apply a bias current at a value that is greater than the threshold current.

The switch-on delay (td) can be approximately represented by the equation $$td = \tau \ln \frac{I_m}{I_m + I_b - I_q}$$

where
$I_m$ is the modulating current
$I_b$ is the bias current
$I_q$ is the threshold current and
$\tau$ is the carrier lifetime (typically of the order of 1 ns to 4 ns).

Thus it can be seen that if the threshold current varies the switch-on delay $t_d$ will also vary unless an adjustment is made to the d.c. bias current $I_b$. A change in the switch-on delay $t_d$ can be important in an optical communication system particularly if $t_d$ increases to such an extent that it becomes significant compared to the shortest desired input pulse length.

On the assumption that the light output of the laser at threshold remains substantially constant irrespective of temperature changes or passage of time we are proposing to monitor the d.c. light level of the laser and to adjust the d.c. bias current ($I_b$) applied to the laser so as to maintain the monitored d.c. light level of the laser at or substantially at a predetermined value which, for digital systems, is at or below the monitored d.c. light output at threshold. For intensity and frequency modulated communication systems it may be desirable to maintain the d.c. bias current ($I_b$) at a value greater than the threshold current. In this way it is hoped to maintain acceptable values of optical output power and switch-on delay $t_d$ throughout the working life of the laser given that the slope efficiency may decrease with time and any increase in temperature.

According to one aspect of the present invention there is provided apparatus for stabilising output characteristics of an injection laser comprising first means for producing an electrical signal indicative of the d.c. optical output level of the laser, second means for producing a reference electrical signal which is indicative of a predetermined d.c. output light level, third means for comparing the electrical signal with the reference signal to produce a difference signal, and means for feeding the difference signal to d.c. bias control means of the laser, the d.c. bias control means being responsive to said difference signal to adjust the d.c. bias level such that the d.c. light output level remains substantially at the predetermined level.

The predetermined level may be the substantially constant threshold light output level of the laser. It has been found that the light output of given lasers, operating at threshold current, may remain approximately constant, and independent of variations in temperature or degradation resulting from the passage of time.

The first means may comprise a photodiode and means for sensing the lowest level of the signal produced by the photodiode. The photodiode may be arranged either to sample a proportion of the light emitted from the front face of the laser or to monitor the light emitted from the back face of the laser.

In view of the variation of slope efficiencies $\alpha$ and $\beta$ with both temperature and passage of time it is also proposed to monitor the mean or peak or other level of optical output power of the laser and to maintain this at a predetermined substantially constant value.

According to another aspect of the present invention there is provided apparatus for stabilising output characteristics of an injection laser comprising first means for producing an electrical signal indicative of a preselected optical output level of the laser, second means for producing a reference electrical signal indicative of a predetermined value of said optical output level, third means for comparing the electrical signal with the reference signal to produce a difference signal, and means for feeding the difference signal to modulating current drive means for the laser, said drive means being responsive to said difference signal to adjust the modulating drive current applied to the laser such that the preselected optical output level remains substantially at said predetermined level. Preferably the preselected level is the mean optical output level or the peak optical output level.

The first means may comprise a photodiode and means for sensing the mean or peak level of the signal produced by the photodiode. The photodiode may be arranged either to sample a proportion of the light emitted from the front face of the laser or to monitor the light emitted from the back face of the laser.

A preferred embodiment of the invention includes both of said aspects which are arranged with a common photodiode.

The invention will be described now by way of example only with particular reference to the accompanying drawings. In the drawings.

Figure 1:
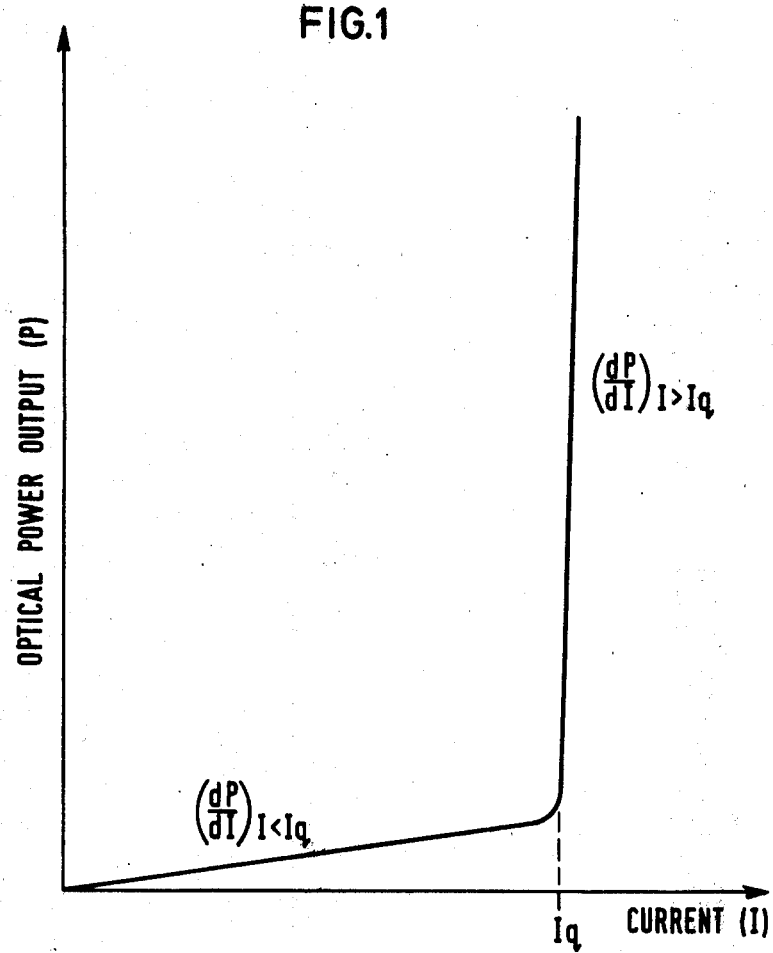
FIG. 1 is a graph illustrating the variation of optical power output with current for an injection laser.

The characteristics of an injection laser which can vary with temperature and time are the laser threshold current $I_q$, the lasing efficiency (dP/dI) $I>I_q$, and the spontaneous efficiency (dP/dI) $I<I_q$. These characteristics are illustrated in FIG. 1 of the drawings. In addition there is a switch-on time delay for lasing action between the application of an input modulating current to the laser and the appearance of the output of light from the laser when the bias current applied to the laser is below the threshold current $I_q$. The switch-on delay $t_d$ can be approximately represented by the following equation $$td = \tau \ln \frac{I_m}{I_m + I_b - I_q}$$

where $I_m$ is the modulating current $I_b$ is the bias current $I_q$ is the threshold current and $\tau$ is the carrier lifetime (typically in the order of 1 nS to 4 nS).

Thus the switch-on delay will vary with variation in the threshold current of the laser. This can be important since, although it may be desirable to bias the laser below the threshold current (for digital systems), the switch-on delay may represent a limitation in the speed of operation of the laser. The switch-on delay is of importance when the laser is used in optical communication systems to transmit information in digital form. The switch-on delay can be important in such systems when it becomes significant compared to the shortest desired input pulse duration. For intensity and frequency modulated optical communication systems, the variation of threshold current and slope efficiency $\alpha$ with temperature and the passage of time is important.

Figure 2:
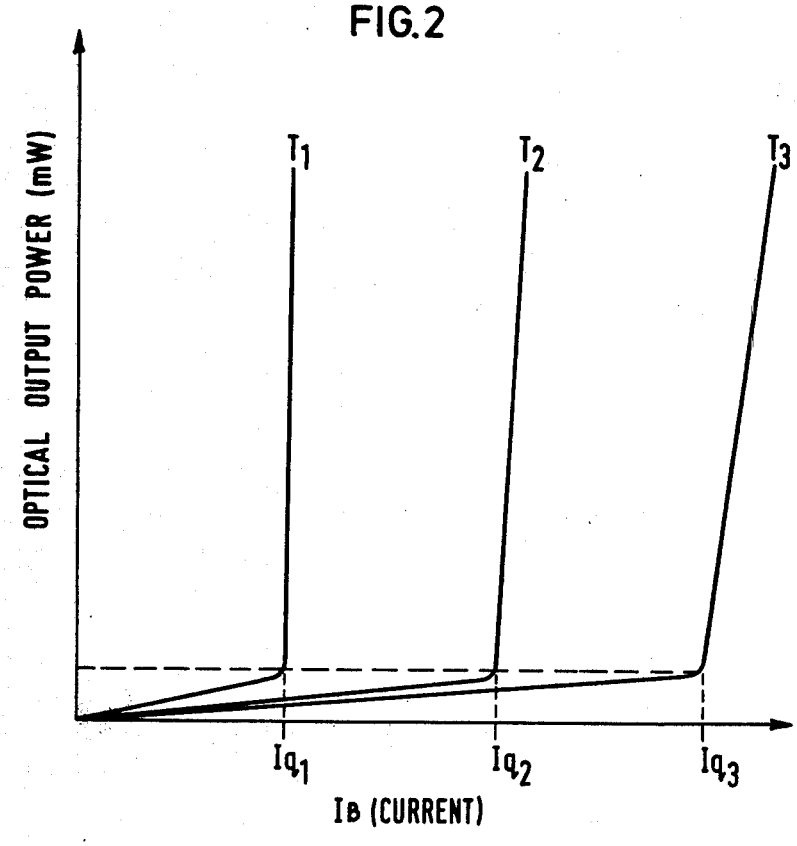
FIG. 2 shows how the characteristics of FIG. 1 may vary with temperature.

We propose to control the d.c. bias by monitoring the d.c. light output level of the laser and adjusting the d.c. bias to maintain the light output level at a substantially constant level. The control means relies for its operation on the assumption that the light output at threshold remains substantially constant irrespective of temperature changes or ageing of the laser. This is illustrated in FIG. 2 for three temperatures $T_1$, $T_2$ and $T_3$.

Figure 3:
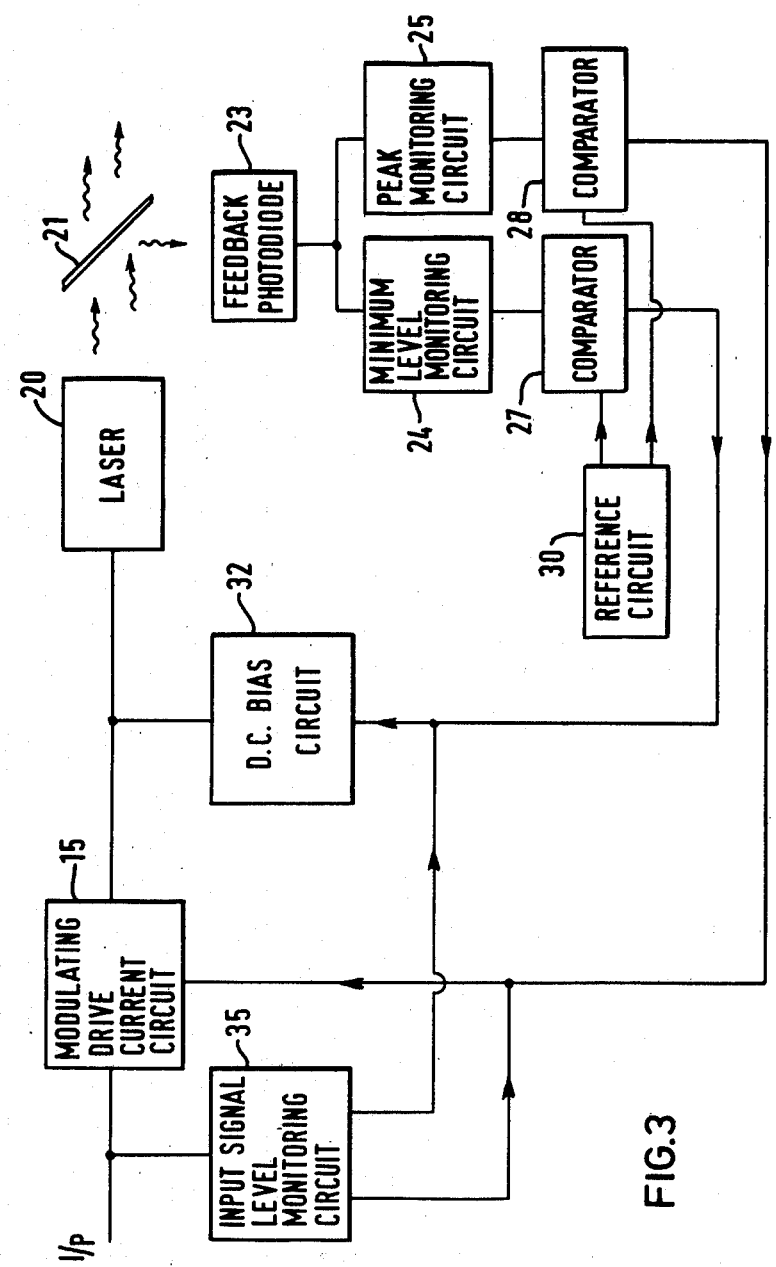
FIG. 3 is a block schematic diagram of one embodiment of apparatus in accordance with the present invention.

Referring now to FIG. 3 there is shown an apparatus for controlling the d.c. bias by monitoring the light output of the laser. The apparatus can also control the peak output light level of the laser. The apparatus of FIG. 3 has a modulating drive current circuit 15 which receives either pulse or analogue data and produces a drive current in response thereto for operating a semiconductor laser 20. Light from the laser is transmitted towards an optical waveguide (not shown) via a semi-reflecting member 21 which deflects a portion of the light towards a photodiode 23. The output of the photodiode is connected to the input of a minimum level monitoring circuit 24 and also to the input of a peak monitoring circuit 25. The minimum level monitoring circuit 24 is arranged to produce an output signal which represents the d.c. light output level of the laser and the peak monitoring circuit 25 produces an output signal which represents the peak optical power output of the laser 20. The output of the minimum level monitoring circuit 24 is connected to a comparator 27 and the output of the peak monitoring circuit 25 is connected to a comparator 28. Each comparator 27, 28 receives an input from a reference circuit 30 the output of the reference circuit 30 representing predetermined light output levels. The reference signal applied to the comparator 27 is indicative of a predetermined d.c. light output level and the reference signal applied to the comparator 28 is indicative of a predetermined peak light output. The output of the comparator 27 is connected to a d.c. bias circuit 32 which provides the d.c. bias signal for the laser 20, and the output of the comparator 28 is connected to the modulating drive current circuit 15. An input signal level monitoring circuit 35 is connected to the modulating circuit 15 and to the bias circuit 32.

In the circuit of FIG. 3 the modulating drive current circuit 15 can comprise a bipolar transistor which is arranged to vary the current through the laser 20 according to the difference signal received from the comparator 25. Alternatively the circuit 15 can be an FET which is connected in parallel with the laser, the difference signal being applied to the gate of the FET.

The minimum level and peak level monitoring circuits can each comprise a conventional diode and capacitance detector. The comparators 27, 28 each comprise a low offset operational amplifier. The output of the photodiode 23 is connected to the circuits 24, 25 by a d.c. coupled, temperature compensated amplifier.

The d.c. bias circuit 32 can be a ramp circuit which controls the d.c. bias current according to the difference signal from the comparator 27.

The input signal level monitoring circuit 35 can be a diode-capacitance detection circuit for detecting data pulses at the input to the drive circuit 15. The circuit 35 is provided to ensure that the drive circuit 15 and bias circuit 32 are only operational when data pulses are fed to the laser.

In use if the d.c. light output level of the laser varies the output of the minimum level monitoring circuit 24 will vary and a difference signal will be produced by the comparator 27 which difference signal is fed to the d.c. bias circuit 32. The d.c. bias circuit operates to vary the output level of the laser 20 so that the d.c. light output level is returned to the value represented by the reference circuit 30. In this way the d.c. light output of the laser 20 is maintained at a constant level. The peak monitoring circuit 25 is provided to monitor peak optical output power of the laser and maintain this at a constant level in view of the possible variation of slope efficiency of the laser with temperature and time. If the peak output value varies this is sensed by the comparator 28 which provides an appropriate signal for the modulating drive current circuit. The modulating current provided by the modulating drive current circuit is then varied appropriately to return the peak output to its predetermined value.

Thus it will be seen that the present arrangement provides a means for controlling the d.c. bias current in order that it may be maintained within certain limitations. In the case of digital systems the arrangement maintains the switch-on delay to within certain limitations. The arrangement also monitors the peak output light level of the laser and maintains this at a constant level.

The embodiment described with reference to FIG. 3 monitors the peak output light level of a laser. An alternative to this arrangement is one which monitors the mean optical output level of the laser.

As explained above laser switch-on delay occurs when the d.c. bias current applied to the laser is below the threshold current. The main effects of the switch-on delay in the performance of an optical communications system using optical fibres are:

(a) a reduction in the power of the pulses transmitted down the optical fibre.

(b) mis-equalisation in the decision circuitry because the received pulses are of shorter duration than an equaliser of the circuitry is designed to accommodate.

The relative importance of these two effects depends upon the method by which the laser is driven i.e. whether by NRZ (non return to zero) or by RTZ (return to zero) pulses. We have found that a reduction in pulse power significantly affects the system particularly when reduced width RTZ pulses are used.

Figure 4:
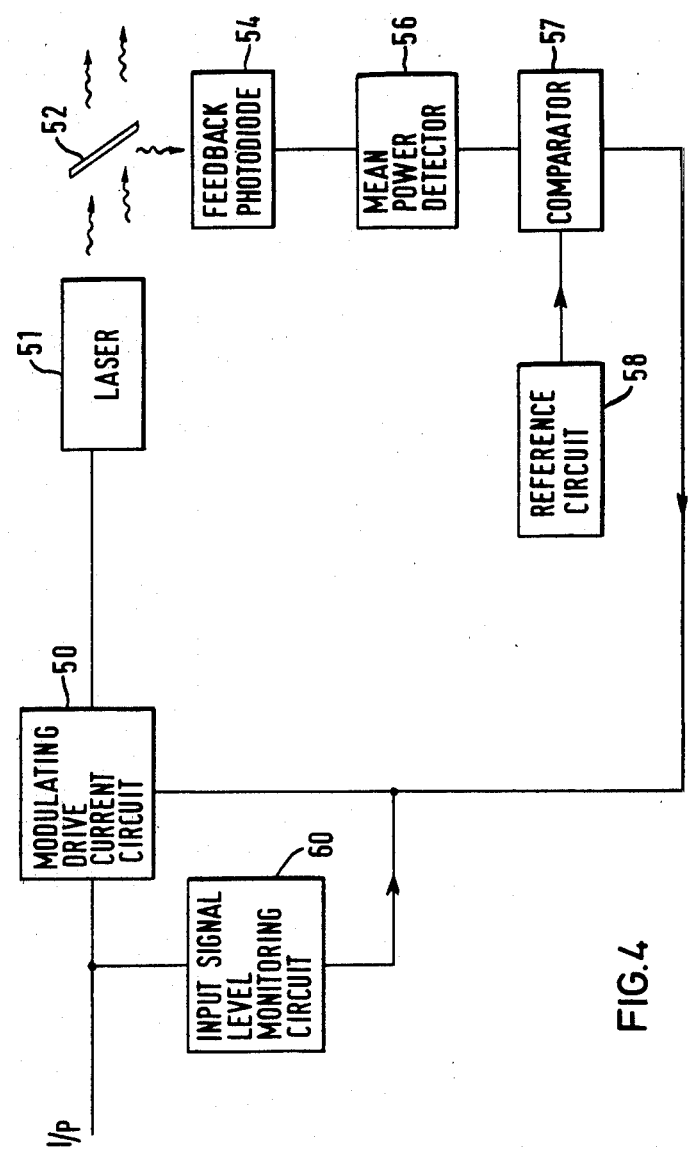
FIG. 4 is a block schematic diagram of another embodiment of apparatus in accordance with the present invention.

We have devised an arrangement which monitors the mean optical output level of a laser and maintains the optical output pulse power of the laser constant by varying the amplitude of the pulse. The arrangement is shown in FIG. 4. This arrangement has a modulating drive current circuit 50 which receives either pulse or analogue data and produces a drive current in response thereto for operating a semiconductor laser 51. Light from the laser is transmitted towards an optical waveguide (not shown) via a semi-reflecting member 52 which deflects a portion of the light towards a photodiode 54. The output of the photodiode is connected to the input of a mean power detector 56 which produces an output signal indicative of the mean optical power output level of the laser 51. The output of the detector 56 is connected to a comparator 57 which also receives a signal from a reference circuit 58, the signal from the reference circuit 58 being indicative of a predetermined mean optical power output. The output of the comparator 57 is connected to the circuit 50. An input signal level monitoring circuit 60 is connected between the input of the drive current circuit 50 and the output from the comparator 57.

In the arrangement of FIG. 4 the blocks can be constituted by similar components to those described with reference to FIG. 3 with the exception that the photodiode 54 is connected to the comparator 57 by a large value resistor which effectively forms the block 56. The voltage signal across this resistor is applied to the comparator 57.

In use the output signal of the comparator 57 is used to control the amplitude of the input current drive pulses to maintain the optical power output constant in a manner similar to that described with reference to FIG. 3. For example, consider an increase in switch-on delay of the laser. In the case of RTZ pulse operation the result is that the pulse duration is reduced and the amplitude of the pulses increased to maintain constant optical power output. In the case of NRZ pulse operation the first pulse in a level 0 to level 1 transition is of shorter duration and the amplitude of the pulses is increased to maintain constant optical power output.

Figure 5:
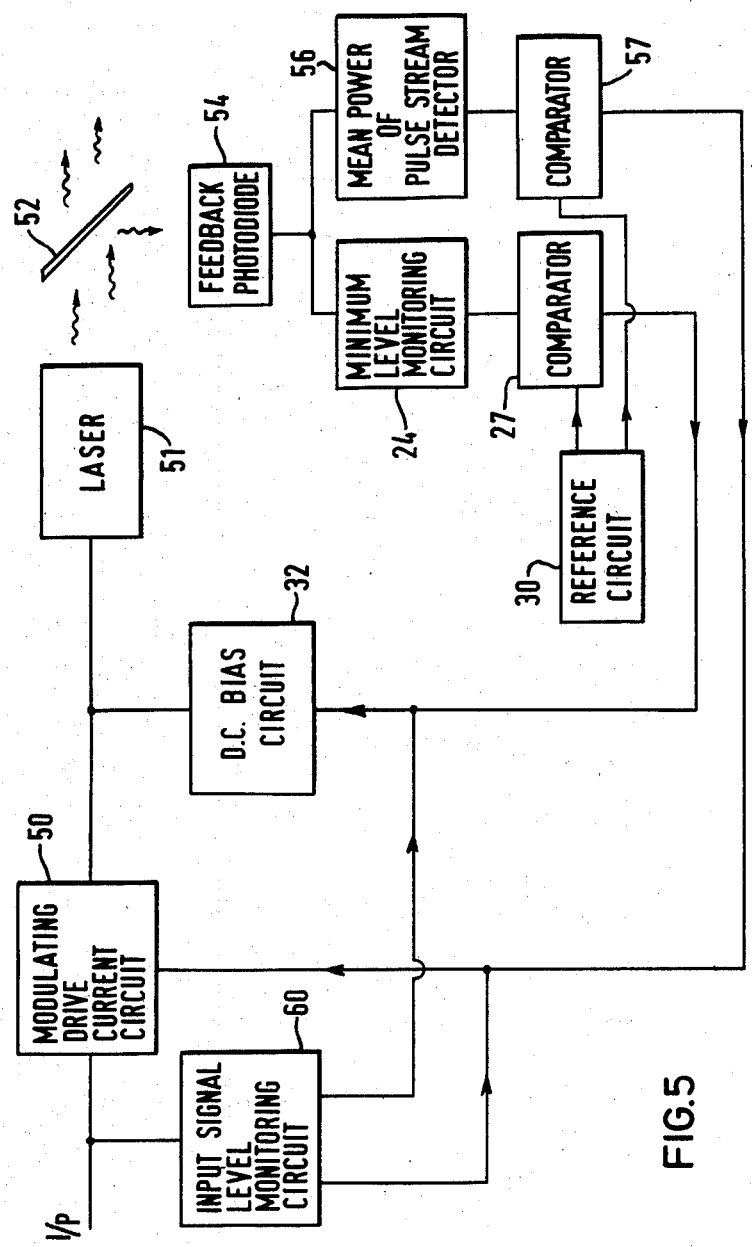
FIG. 5 is a block schematic diagram of a further embodiment of apparatus in accordance with the present invention.

The arrangement shown in FIG. 4 is suitable for relatively low speed systems (e.g. 8 Mbits/sec). For higher speed systems (e.g. 140 Mbits/sec) the switch-on delay when pulsing from zero bias may be too large and a d.c. bias current, control led relative to threshold, may have to be employed in addition to the mean power output control. Such an arrangement is shown in FIG. 5. The d.c. bias current control operates in a manner similar to that described for FIG. 3 whilst the mean power output control is similar to that described with reference to FIG. 4 with the exception that it is designed to respond to the mean of pulse component of the optical output of the laser rather than the mean of total optical power output.

We claim:

1. In combination with an injection laser having current supply means for supplying a d.c. bias current to the laser and current drive circuitry for supplying current pulses to said laser, apparatus for stabilizing the output characteristics, comprising:

light sensitive means for producing a first electrical signal indicative of the optical output level of said laser;

means for sensing the lowest level of said electrical signal to produce a second electrical signal indicative of the optical output level of said laser at said d.c. bias current;

second means for producing a first reference electrical signal which is indicative of a predetermined d.c. bias current light output level;

third means for comparing said second electrical signal with said first reference signal to produce a first difference signal;

means for feeding said first difference signal to said d.c. bias current supply means, said d.c. bias current supply means being responsive to said first difference signal to adjust the d.c. bias level such that the d.c. light output level remains substantially at the predetermined level;

fourth means for sensing a preselected level of the first electrical signal to produce a third electrical signal indicative of a preselected light output level of said laser;

fifth means for producing a second reference electrical signal indicative of a predetermined light output level;

sixth means for comparing said third electrical signal with said second reference signal to produce a second difference signal; and means for feeding said second difference signal to modulate said current drive means for said laser, said drive means being responsive to said second difference signal to adjust said drive current applied to said laser such that the optical output level remains substantially at said predetermined level.

2. Apparatus as claimed in claim 1 wherein said predetermined level is the peak optical output level.

3. Apparatus as claimed in claim 1 wherein said predetermined level is the mean optical output level.

4. Apparatus as claimed in claim 1 wherein said light sensitive means is a photodiode.

* * * * *